(12) United States Patent
Perego

(10) Patent No.: US 9,165,621 B2
(45) Date of Patent: Oct. 20, 2015

(54) MEMORY SYSTEM COMPONENTS THAT SUPPORT ERROR DETECTION AND CORRECTION

(71) Applicant: Rambus Inc., Sunnyvale, CA (US)

(72) Inventor: Richard E. Perego, Thornton, CA (US)

(73) Assignee: Rambus Inc., Sunnyvale, CA (US)

( * ) Notice: Subject to any disclaimer, the term of this patent is extended or adjusted under 35 U.S.C. 154(b) by 58 days.

(21) Appl. No.: 14/160,290

(22) Filed: Jan. 21, 2014

(65) Prior Publication Data

US 2014/0133259 A1  May 15, 2014

Related U.S. Application Data

(62) Division of application No. 13/326,590, filed on Dec. 15, 2011, now Pat. No. 8,644,104.

(60) Provisional application No. 61/433,081, filed on Jan. 14, 2011.

(51) Int. Cl.
*G11C 8/00* (2006.01)
*G06F 11/10* (2006.01)
*G11C 29/04* (2006.01)

(52) U.S. Cl.
CPC .............. *G11C 8/00* (2013.01); *G06F 11/1048* (2013.01); *G06F 11/1016* (2013.01); *G11C 2029/0411* (2013.01)

(58) Field of Classification Search
CPC  G06F 11/1016; G06F 11/1004; G06F 11/167
USPC ........... 365/185.09, 185.11, 189.011, 189.15, 365/189.16, 189.14, 189.2, 200, 230.01, 365/230.03, 230.06
See application file for complete search history.

(56) References Cited

U.S. PATENT DOCUMENTS

| 4,398,248 A | 8/1983 | Hsia et al. |
| 4,748,627 A | 5/1988 | Ohsawa |

(Continued)

FOREIGN PATENT DOCUMENTS

WO   WO-2012-051039 A1   4/2012

OTHER PUBLICATIONS

International Preliminary Report on Patentability (Chapter I) dated Apr. 25, 2013 in International Application No. PCT/US2011/055068. 7 pages.

(Continued)

*Primary Examiner* — Fernando Hidalgo

(57) ABSTRACT

The disclosed embodiments relate to components of a memory system that support error detection and correction by means of storage and retrieval of error correcting codes. In specific embodiments, this memory system includes a memory device, which further contains a memory bank. During operation, the memory device receives a request to concurrently access a data word at a first row in a first storage region of the memory bank and error information associated with the data at a second row in a second storage region of the memory bank. Moreover, the memory request includes a first row address identifying the first row and a second row address identifying the second row. Next, the memory device routes the first row address and the second row address to a first row decoder and a second row decoder in the memory bank, respectively. Finally, the memory device uses the first row decoder to decode the first row address to access the first row and concurrently uses the second row decoder to decode the second row address to access the second row.

20 Claims, 7 Drawing Sheets

(56) References Cited

U.S. PATENT DOCUMENTS

| | | |
|---|---|---|
| 7,562,285 B2 | 7/2009 | Wang et al. |
| 7,676,730 B2 | 3/2010 | Haugan et al. |
| 7,734,985 B2 | 6/2010 | Bains |
| 7,783,957 B2 | 8/2010 | Carnevale et al. |
| 7,831,882 B2 | 11/2010 | Tsern et al. |
| 7,831,888 B2 | 11/2010 | Wang et al. |
| 7,836,378 B2 | 11/2010 | Shaeffer et al. |
| 7,882,423 B2 | 2/2011 | Wang et al. |
| 8,132,077 B2 | 3/2012 | Wang et al. |
| 8,132,086 B2 | 3/2012 | Park et al. |
| 2002/0120887 A1 | 8/2002 | Hughes et al. |
| 2004/0261049 A1 | 12/2004 | Mohr et al. |
| 2006/0117152 A1* | 6/2006 | Amidi et al. .................. 711/154 |
| 2007/0109856 A1 | 5/2007 | Pellicone et al. |
| 2008/0109700 A1 | 5/2008 | Lee et al. |
| 2008/0195894 A1 | 8/2008 | Schreck et al. |
| 2008/0215955 A1 | 9/2008 | Kimbara et al. |
| 2008/0266990 A1 | 10/2008 | Loeffler |
| 2008/0294841 A1 | 11/2008 | Carnevale et al. |
| 2009/0055714 A1 | 2/2009 | Bains et al. |
| 2009/0129155 A1 | 5/2009 | Honda et al. |
| 2009/0235113 A1 | 9/2009 | Shaeffer et al. |
| 2009/0276587 A1 | 11/2009 | Moyer et al. |
| 2010/0107036 A1 | 4/2010 | Resnick |
| 2010/0128541 A1 | 5/2010 | Russell et al. |
| 2011/0016278 A1 | 1/2011 | Ware et al. |
| 2011/0119551 A1 | 5/2011 | Tsern et al. |
| 2011/0138251 A1 | 6/2011 | Pawlowski |
| 2013/0179751 A1 | 7/2013 | Linstadt |
| 2015/0006984 A1* | 1/2015 | Strasser et al. ................ 714/721 |

OTHER PUBLICATIONS

International Search Report and Written Opinion dated Feb. 28, 2012 re International Application No. PCT/US2011/055068. 10 pages.

\* cited by examiner

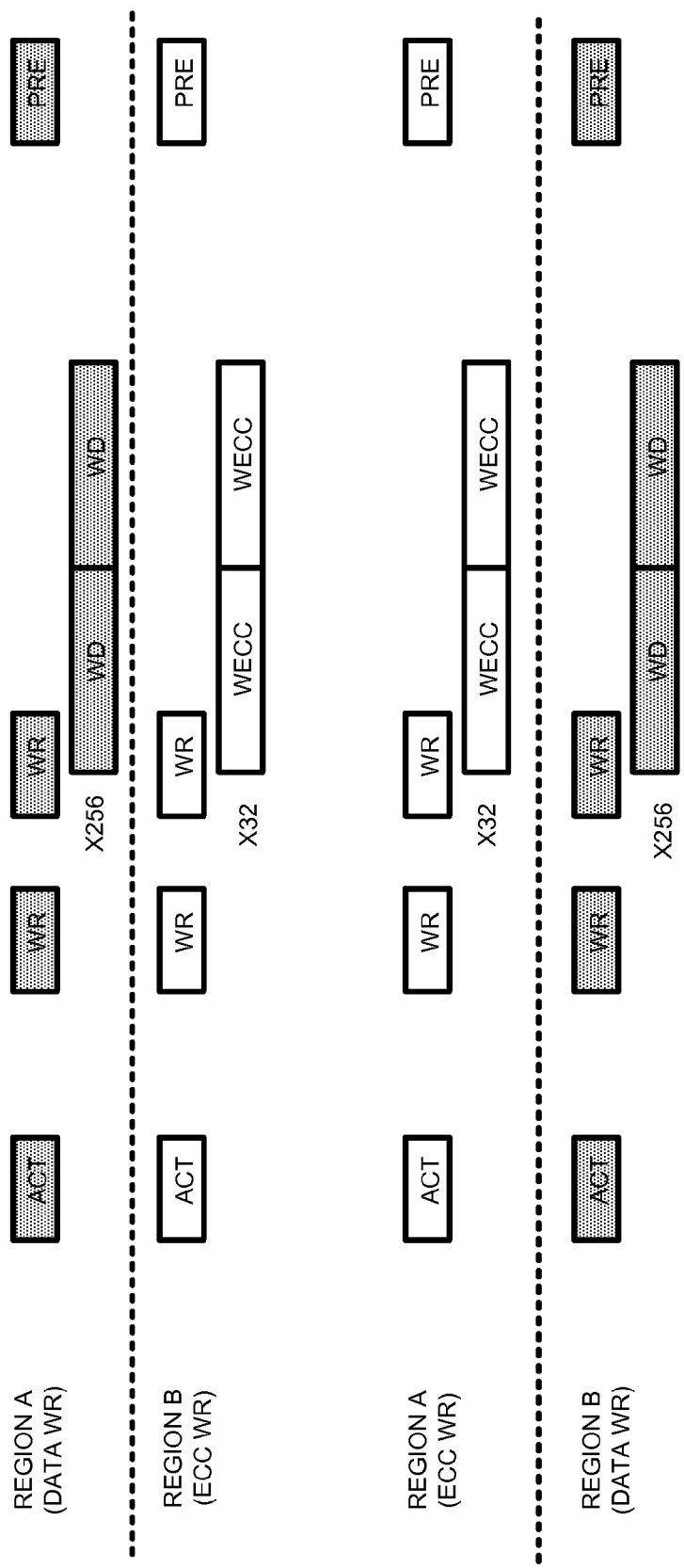

MEMORY SYSTEM COMPONENTS THAT SUPPORT ERROR DETECTION AND CORRECTION

RELATED APPLICATION

This application hereby claims priority under 35 U.S.C. §119 to U.S. Provisional Application No. 61/433,081, filed on 14 Jan. 2011 and U.S. patent application Ser. No. 13/326,590, filed on 15 Dec. 2011, each entitled "Memory System Components that Support Error Detection and Correction" and filed on behalf of first named inventor Richard E. Perego. Each of these aforementioned applications is hereby incorporated by reference.

TECHNICAL FIELD

The disclosed embodiments generally relate to the design of memory devices, controllers, and applicable systems. More specifically, the disclosed embodiments relate to memory devices, controllers and systems that support error detection and error correction.

BACKGROUND

Error detection and correction (EDC) techniques may be used in electronic systems to detect and correct errors that arise during memory accesses. These techniques typically operate by storing a data word along with an associated error correcting code (ECC). ECCs can be communicated to and from a memory device by communicating ECCs spatially in parallel with data signals via wider datapaths, by temporally multiplexing ECCs with data signals via shared datapaths, or by some combination of these approaches, which may require additional memory for ECC storage. As a result, a non-power-of-2 memory size may be required. To implement temporal multiplexing, the memory system bandwidth will be degraded by the fraction of bandwidth consumed by ECCs. This degradation of memory system bandwidth can be further aggravated by inefficiencies related to the scheduling of memory transactions involving ECCs.

BRIEF DESCRIPTION OF THE FIGURES

FIG. 7 illustrates the timing for various signals, including memory access signals, and data and ECC signals during write transactions between a memory controller and an exemplary memory system.

Table 1 illustrates different scenarios for routing a data access address RA[10:0] and an ECC access address ECC [10:0] onto different partitions of a memory bank based on a two-bit selection signal RA[12:11].

DETAILED DESCRIPTION

The disclosed embodiments relate to components of a memory system that support error detection and correction by means of storage and retrieval of error correcting codes. In specific embodiments, this memory system includes a memory device, such as a dynamic random access memory (DRAM) device. This memory device further contains a memory bank (or multiple banks) which includes at least two independently accessible storage regions, including a first storage region (e.g., a first memory array) and a second storage region (e.g., a second memory array). The memory bank also includes, among other things: (1) a first row decoder to access the first storage region in response to a first row address; and (2) a second row decoder to access the second storage region in response to a second row address. This memory device also includes an interface circuit coupled to the memory bank to receive a memory access command and generate the first row address and the second row address, wherein the first row address specifies an access of data at a first row in the first storage region of the first memory bank, and the second row address specifies an access of error information associated with the data at a second row in the second storage region of the first memory bank. Note that the term "error information" throughout this disclosure is broadly defined as any information that can be used or associated with detecting an error that occurs within the data, including the error information itself. Moreover, the term "ECC" throughout this specification refers to error information used in a memory system for error detection and correction.

In some embodiments, a memory controller for the memory system effectuates access to a data word from the first storage region of the memory bank in parallel with accessing a corresponding ECC for the first data word from the second storage region of the memory bank. In some embodiments, the memory controller effectuates storage of unprotected data words in the first storage region of the memory bank without the associated ECCs by disabling the transmission of the ECC for the unprotected data words.

Figure 1:
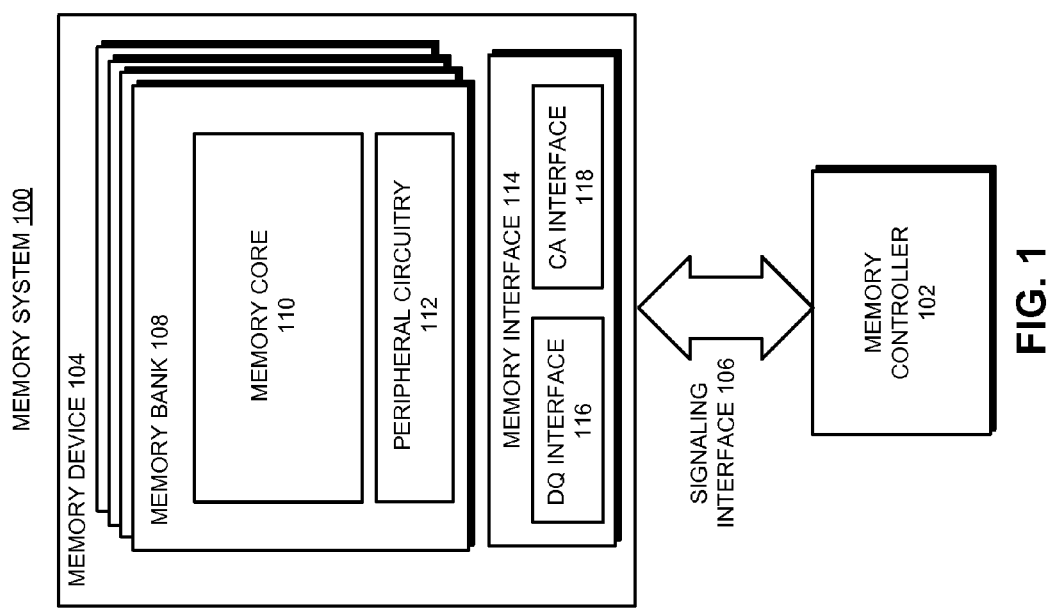
FIG. 1 presents a block diagram illustrating an embodiment of a memory system that includes a controller coupled to a multi-bank memory device.

In one embodiment, the memory system includes a memory controller integrated circuit ("IC") chip ("memory controller" or "controller" hereafter) coupled to one or more memory IC chips ("memory components" or "memory devices" hereafter) through a signaling interface. For example, FIG. 1 presents a block diagram illustrating an embodiment of memory system 100, which includes a controller 102 coupled to a multi-bank memory device (such as a dynamic random access memory "DRAM" device) 104 through a signaling interface 106. While FIG. 1 illustrates memory system 100 having one memory controller and four memory banks 108, other embodiments may have additional controllers and/or fewer or more memory banks 108.

A given memory bank 108 within multi-bank memory device 104 includes at least one memory core 110 containing a storage cell array. Memory bank 108 also includes peripheral circuitry 112. In some embodiments, peripheral circuitry 112 contains one or more row decoders for decoding row addresses associated with memory transactions and one or more column decoders for decoding column addresses associated with memory transactions (not shown in FIG. 1). Peripheral circuitry 112 can also include a column I/O for driving or sensing the appropriate subset of data lines associated with read or write transactions to or from memory core 110 (not shown in FIG. 1). Memory bank 108 is coupled to a memory interface 114 (within memory device 104) which provides circuitry to communicate with memory controller 102 through signaling interface 106. As illustrated in FIG. 1, memory interface 114 further contains a DQ (data input/output) interface 116 for receiving write data for write transactions and outputting read data for read transactions and a control/command/address interface (CA interface) 118 for receiving commands and associated addresses, as applicable. In one embodiment, memory controller 102 and memory device 104 are manufactured on separate integrated circuit (IC) chips. In some embodiments, these separate IC chips can be included in the same package using a through-silicon via (TSV) or other packaging techniques.

Figure 2:
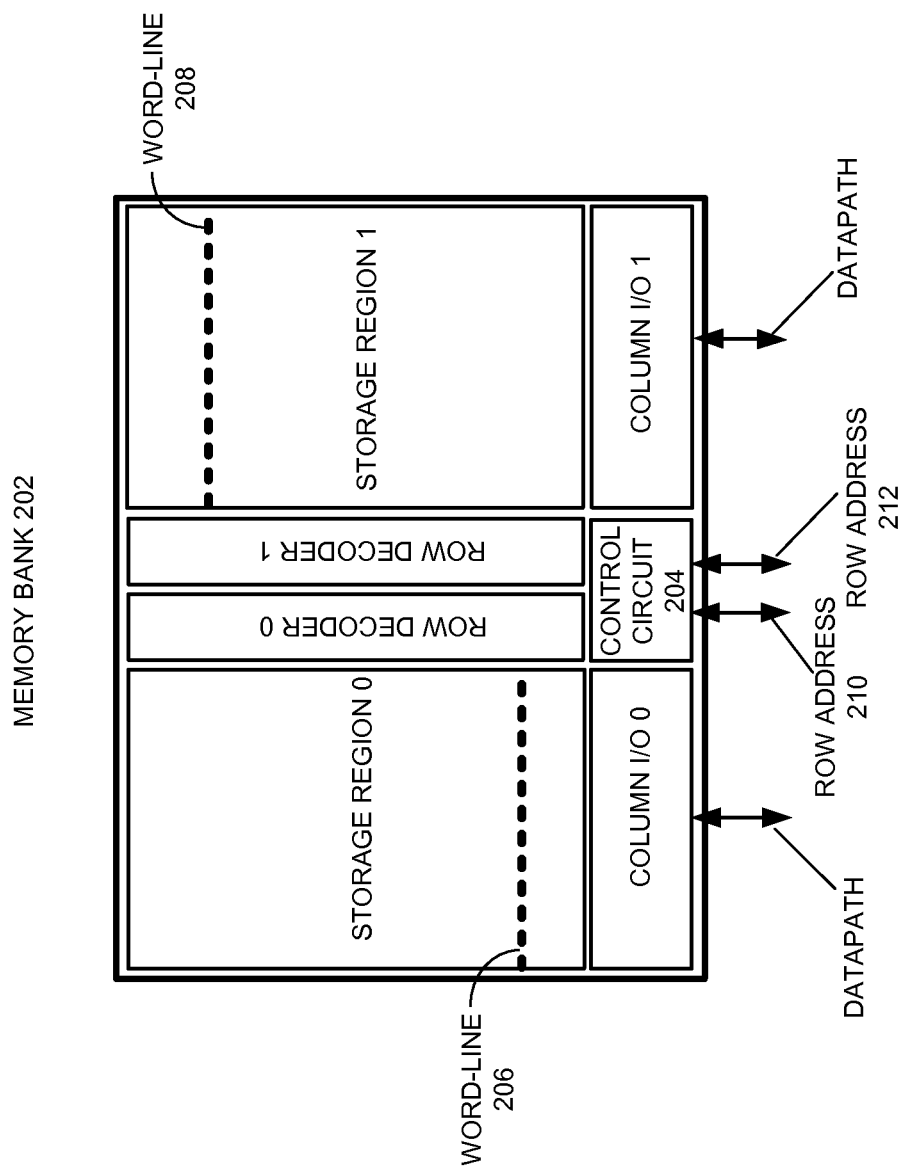
FIG. 2 illustrates an exemplary memory bank within a memory device that supports at least two independently addressable memory core regions.

FIG. 2 illustrates an exemplary memory bank 202 within a memory device (e.g., memory bank 202 being an exemplary embodiment of memory bank 108 in FIG. 1) that supports at least two independently addressable storage regions and at least one row decoder for each of the storage regions. More specifically, memory bank 202 includes a storage region 0 (or "region 0") and a storage region 1 (or "region 1"). Note that each of storage region 0 and storage region 1 has a dedicated row decoder (i.e., row decoder 0 and row decoder 1, respectively) which, in an embodiment, are positioned side-by-side between the two storage regions. In the embodiment shown, each of the two storage regions is also associated with a dedicated column I/O: column I/O 0 and column I/O 1, respectively, while the two storage regions share a common control circuit 204. In the embodiment shown, the two storage regions can be obtained by partitioning a single memory core in a memory bank into two sets of columns. For example, the two storage regions can be obtained by partitioning a single memory core into two equal sets of memory cells. In this embodiment, the two column I/Os 0 and 1 can provide equal bandwidth. In other embodiments, the two storage regions are produced by partitioning a single memory core into two regions having different sizes. In these embodiments, the two column I/Os 0 and 1 can support different bandwidths based on the partitioning ratio.

Note that memory bank 202 can be formed by partitioning the rows of a single memory core in a memory bank into two equal halves of memory cells and adding another row decoder. Another embodiment groups two single core memory banks into one logical bank which contains two memory cores and two associated row decoders.

In one embodiment, region 0 stores data information while region 1 stores error information, such as an ECC associated with the data information in region 0. Moreover, a data access to region 0 is accompanied by a concurrent ECC access to region 1. For example, a write access directed to a data word associated with a word-line 206 in region 0 is executed concurrently with a corresponding write access to an ECC associated with the data word which is directed to a word-line 208 in region 1. Similarly, a read access to a data word located at a location in region 0 can be performed concurrently with a corresponding read access to an ECC associated with the data word located in region 1.

More specifically, during these concurrent memory accesses (including both read accesses and write accesses), control circuit 204 can simultaneously receive row addresses 210 and 212, e.g., from an external CA interface, wherein row address 210 is directed to word-line 206 in region 0 and row address 212 is directed to word-line 208 in region 1. In one embodiment, row addresses 210 and 212 are generated from a single memory address associated with a memory reference, which is generated by a memory controller coupled to memory bank 202. Row addresses 210 and 212 can be generated from the memory address on an application-specific integrated circuit (ASIC) coupled between memory bank 202 and the memory controller. In some embodiments, row addresses 210 and 212 are generated from the memory address in a circuit on memory bank 202. In another embodiment, row addresses 210 and 212 are generated from the memory address by a circuit on the memory controller which generated the memory address. In this embodiment, row addresses 210 and 212 are then transmitted from the memory controller to memory bank 202. Upon receiving the row addresses, control circuit 204 then routes the two row addresses to row decoder 0 and row decoder 1, respectively. Next, row decoder 0 decodes row address 210 to access word-line 206 for the data access, and row decoder 1 decodes row address 212 to access word-line 208 for the ECC access. As a result, both word-line 206 in memory region 0 and word-line 208 in memory region 1 are activated. In one embodiment, the data access and ECC access can have the same or different column addresses.

The data access widths of region 0 and region 1 can vary depending upon whether a particular region is performing a data access or ECC access, and these data access widths can be determined based on a ratio of the size of the data word to the size of the associated ECC. In one embodiment, the ratio of the sizes of the data access width to the ECC access width is 8:1. In other words, the number of bit-lines utilized for a data access is eight times that of an ECC access. However, other embodiments can have different access width ratios.

Figure 3:
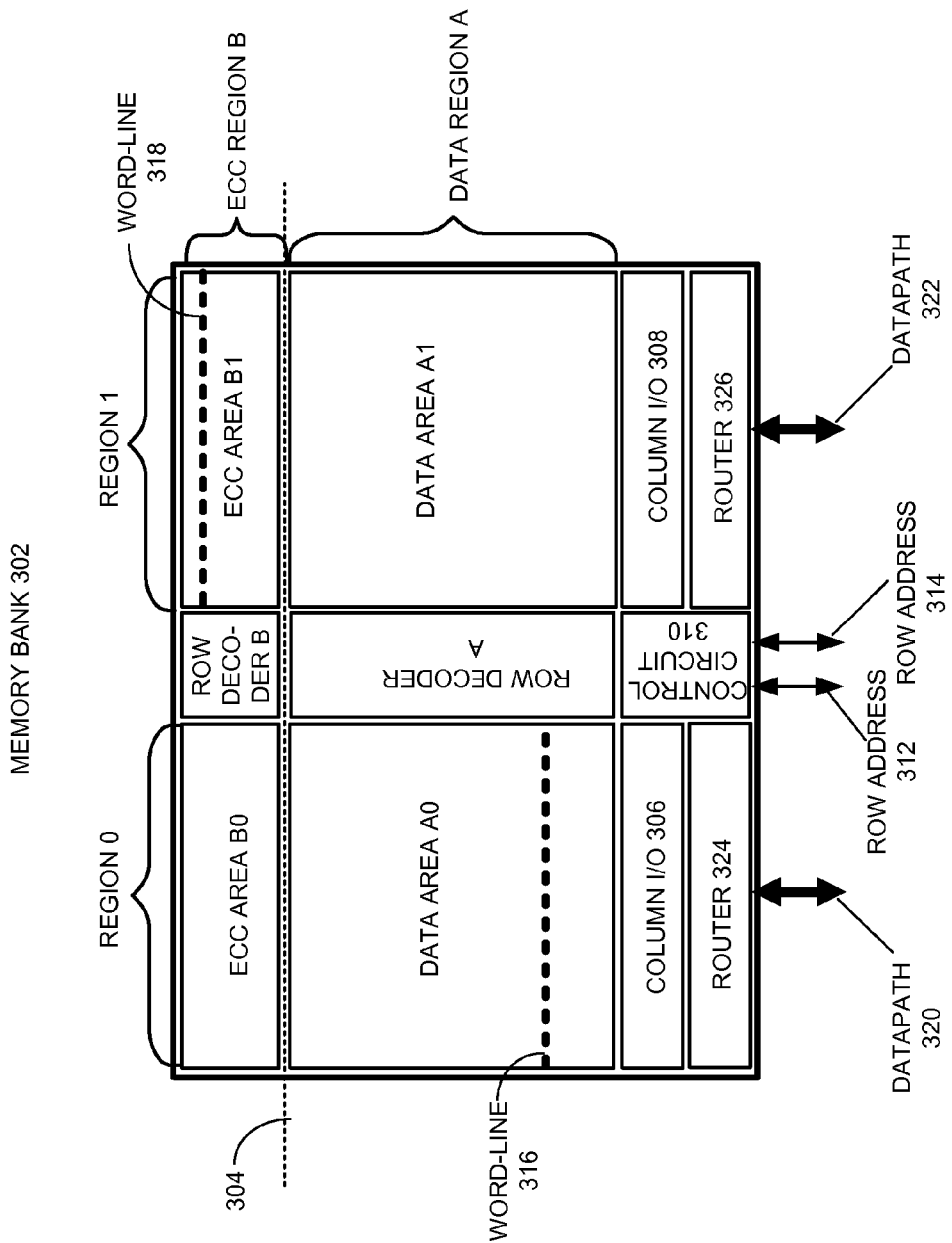
FIG. 3 illustrates an exemplary memory bank which supports at least two independently addressable storage regions with at least one centrally located row decoder for each of the storage regions.

FIG. 3 illustrates an exemplary memory bank 302 within a memory device (e.g., memory bank 302 being an exemplary embodiment of memory bank 108 in FIG. 1) which supports at least two independently addressable storage regions with centrally located row decoders for the storage regions.

Like memory bank 202 illustrated in FIG. 2, memory bank 302 is partitioned along a column boundary into two storage regions 0 and 1. However, in memory bank 302, each of regions 0 and 1 is further partitioned into a data area (i.e., data area A0 and data area A1) and an ECC area (i.e., ECC area B0 and ECC area B1) along a word-line boundary 304. The two data areas A0 and A1 form a data region A which is located below boundary 304, while the two ECC areas B0 and B1 form an ECC region B which is located above boundary 304. Moreover, each of the two regions A and B is associated with a dedicated row decoder: row decoder A for data region A and row decoder B for ECC region B. Also, row decoders A and B are centrally located within associated storage regions A and B in memory bank 302. This configuration divides a continuous word-line in each region A or B into two partial word-lines which can be activated independently (as is described in more detail below). In one embodiment, the two areas of each region A or B are substantially the same size. In this embodiment, the two row decoders divide memory bank 302 into an equal-sized left half region (region 0) and right half region (region 1). Note that the two areas A0 and B0 in region 0 share a common column I/O 306, and the two areas A1 and B1 in region 1 share a common column I/O 308.

In one embodiment, a control circuit 310 simultaneously receives two row addresses 312 and 314, e.g., from an external CA interface, wherein row address 312 is used to access data at a location in data region A (without specifying a specific area A0 or A1), and row address 314 is used to access ECC associated with the data at a location in ECC region B (without specifying a specific area B0 or B1). In one embodiment, row addresses 312 and 314 are generated from a single memory address associated with a memory reference, which is generated by a memory controller coupled to memory bank 302. Row addresses 312 and 314 can be generated from the memory address on an ASIC coupled between memory bank 302 and the memory controller. In some embodiments, row addresses 312 and 314 are generated from the memory address in a circuit on memory bank 302.

Upon receiving the row addresses, control circuit 310 routes row addresses 312 and 314 to row decoder A and row decoder B, respectively. Next, row decoder A decodes row address 312 to access a full word-line (not shown) in data region A for the data access and row decoder B decodes row address 314 to access a full word-line (not shown) in ECC region B for the ECC. Note that, for the data access in data region A, the full word-line which is activated comprises two partial word-lines (not shown) in area A0 and area A1, respectively. Similarly, for the ECC access in ECC region B, the full word-line which is activated comprises two partial word-lines (not shown) in area B0 and area B1, respectively.

In some embodiments, the two halves of each storage region A and B can be independently addressed. In other words, each row decoder can be configured to select either the left sub-word-line (i.e., the left half-page) or the right sub-word-line (i.e., the right half-page) of a full word-line within that storage region. In these embodiments, row address 312, which is used to access data at a location in data region A, includes a special bit to select either area A0 or area A1, and row address 314, which is used to access ECC at a location in ECC region B, includes a special bit to select either area B0 or area B1 (which is usually on the opposite side of the row decoders from the selected area in region A for the data access). Control circuit 310 then routes the two row addresses to row decoder A and row decoder B, respectively. Next, row decoder A decodes row address 312, which involves selecting either area A0 or area A1 of region A for the data access based on the special bit in row address 312. At the same time, row decoder B decodes the row address 314, which involves selecting either area B0 or area B1 of region B for the ECC access based on the special bit in row address 314.

For example, FIG. 3 shows that for a data access to data region A, area A0 is selected and a partial word-line 316 in area A0 is activated. The data access is accompanied by a concurrent ECC access to ECC region B, which selects area B1 by activating a partial word-line 318. Note that, because the two storage areas (i.e., A0/B0 or A1/B1) on the same side of the row decoders share a common column I/O and hence share the associated datapath, the concurrent data and ECC accesses are generally directed to two areas on opposite sides of the row decoders (i.e., A0/B1 or A1/B0). Hence, the two concurrent memory accesses to memory bank 302 in FIG. 3 result in two partial word-line activations in the associated storage regions. Compared with the above-described embodiments which require two full word-line activations for the pair of concurrent memory accesses, the embodiments (which enable partial word-line activations) can achieve better power savings. Moreover, by independently addressing the two areas in each storage region A or B, memory bank 302 is essentially partitioned into four independently addressable storage regions, two for data storage and two for ECC storage.

While the above-described example illustrates ½ word-line activation for both data and ECC accesses for power saving purposes, some embodiments can use ¼, ⅛, or other power-of-2 fractional partial word-line activations for the ECC access to achieve further power savings. Similarly, data access can also use partial word-line activations within each of the independently addressable storage regions.

In the above discussion, the configuration of memory bank 302 can be viewed as first partitioning a regular single core memory bank along a row boundary into two regions: region A for data access which contains more rows and region B for ECC access which contains fewer rows, and subsequently dividing each of the two regions into two halves by placing the row decoders between the two regions, thereby creating four independently accessible regions. Another way of viewing the configuration of memory bank 302 is that a regular single core memory bank is partitioned in two half regions along a column boundary, referred to as region 0 and region 1 above, where the row decoders are placed between the two regions. Next, row boundary 304 is established across the two half regions, wherein row boundary 304 divides each half region into top and bottom portions such that the ECC access is directed to the sub-regions on one side of (for example, above) boundary 304 (i.e., ECC region B) and the data access is directed to the other side of (for example, below) boundary 304 (i.e., data region A). Based on the specific storage requirements, boundary 304 may be located to divide data region A and ECC region B according to an 8:1 ratio, such that ⅑th of the rows in the original core fall within ECC region B, and ⁸⁄₉th of the rows fall within data region A. In one embodiment, data accesses and the associated ECC accesses take place on opposite sides of the row decoders.

Note that column I/O 306 and column I/O 308 are coupled to datapath 320 and datapath 322, respectively. Because each of the four areas in memory bank 302 can be accessed independently, each of the datapaths 320 and 322 can be a full bandwidth datapath. Moreover, because each of the datapaths is shared by both a data storage area and an ECC area, a signal router may be used in each datapath to select, for example by using a multiplexer (MUX), between data signals and ECC signals on the type of data being transmitted to or from the memory controller over the respective datapaths 320 and 322. These routers may optionally be located within memory bank 302, for example as routers 324 and 326 illustrated in FIG. 3. In other embodiments, the routers may optionally reside on an ASIC buffer located between memory bank 302 and a memory controller (not shown in FIG. 3). In these embodiments, datapaths 320 and 322 are coupled between column I/Os 306 and 308 and the respective signal routers.

Figure 4:
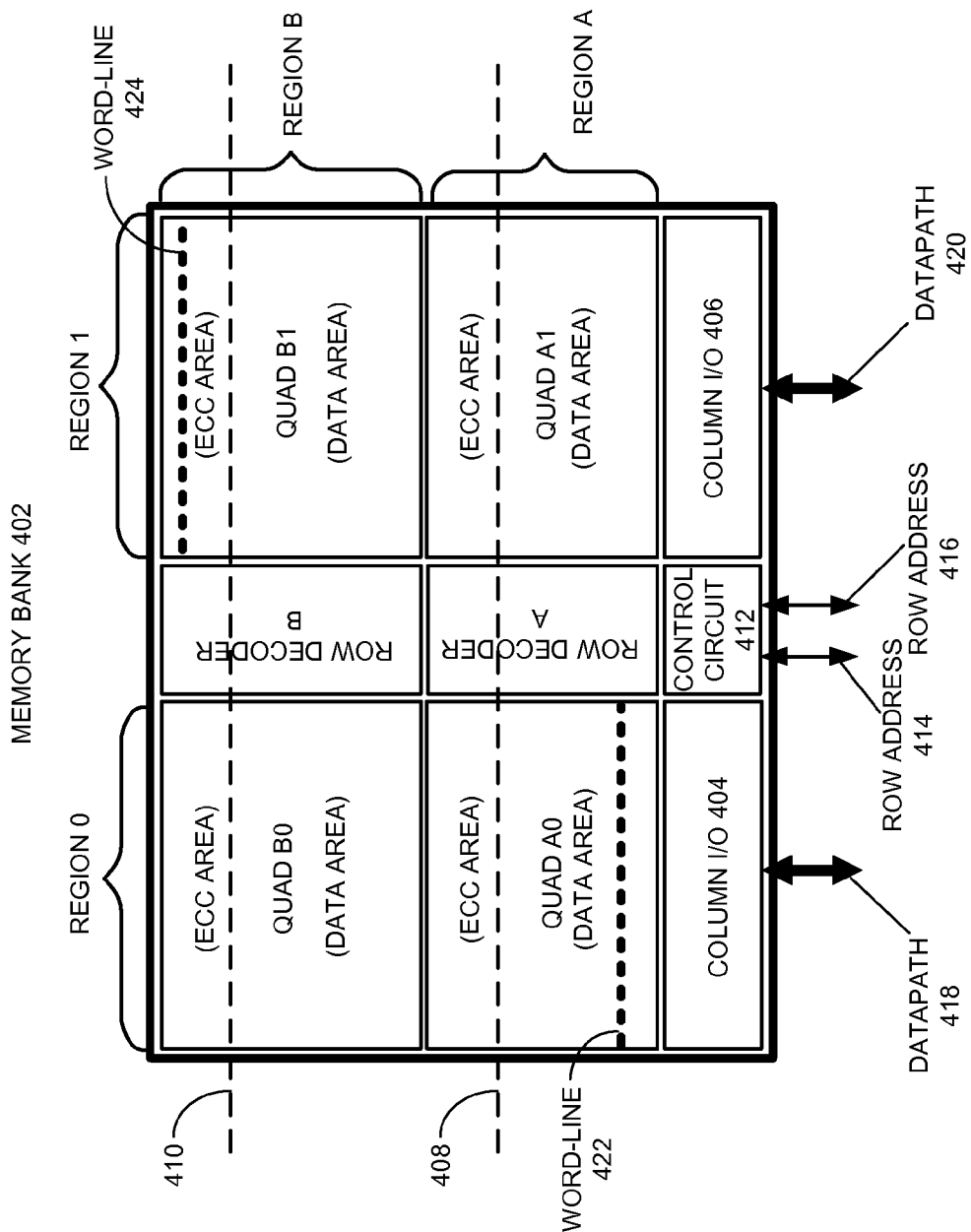
FIG. 4 illustrates an exemplary memory bank which includes four independently addressable storage regions configurable for both data and ECC storage.

FIG. 4 illustrates an exemplary memory bank 402 within a memory device (e.g., memory bank 402 being an exemplary embodiment of memory bank 108 in FIG. 1) which includes four independently addressable storage regions, wherein each of the four storage regions is configurable for both data and ECC storage. As illustrated in FIG. 4, the four regions are labeled as quad A0, quad A1, quad B0, and quad B1. Quad A0 and quad B0 are located on the left hand side (referred to as "region 0") of memory bank 402, while quad A1 and quad B1 are located on the right hand side (referred to as "region 1") of memory bank 402. Note that row decoders A and B are centrally located and effectively separate region 0 from region 1. Quad A0 and quad A1 are located on the opposite sides of row decoder A which they share, and are collectively referred to as "region A" of memory bank 402. Quad B0 and quad B1 are located on the opposite sides of row decoder B which they share, and are collectively referred to as "region B" of memory bank 402. While not necessarily sharing the same row decoder, quad A0 and quad B0 in region 0 can share a common column I/O 404; and quad A1 and quad B1 in region 1 can share a common column I/O 406.

Note that the above implementation differs from the four independently addressable areas in memory bank 302 because each of the four regions in memory bank 402 can be configured to support both data accesses and ECC accesses. Hence, a partition boundary 408 in region A can indicate the partition of quad A0 and quad A1 into respective data and ECC storage areas. Similarly, a partition boundary 410 in region B can indicate the partition of quad B0 and quad B1 into respective data and ECC storage areas. In the exemplary embodiment in FIG. 4, the areas above the partition boundaries 408 and 410 are the ECC storage areas, and the areas below the partition boundaries 408 and 410 are the data storage areas. In one embodiment, the location of each of the partition boundaries 408 and 410 is programmable by the memory controller and hence is variable.

In one embodiment, during memory operations on memory bank 402, a control circuit 412 can concurrently receive two row addresses 414 and 416, e.g., from an external CA interface, wherein row address 414 is used to access data at a location in region A without specifying a sub-region of quad A0 or quad A1, and row address 416 is used to access ECC associated with the data at a location in region B without specifying a sub-region of quad B0 or quad B1. In one embodiment, row addresses 414 and 416 are generated from a single memory address associated with a memory reference, which is generated by a memory controller coupled to memory bank 402. Row addresses 414 and 416 can be generated from the memory address on an ASIC coupled between memory bank 402 and the memory controller. In some embodiments, row addresses 414 and 416 are generated from the memory address in a circuit on memory bank 402.

Upon receiving the row addresses, control circuit 412 routes row addresses 414 and 416 to row decoders A and B, respectively. Next, row decoder A decodes row address 414 to access the location in region A for the data access, and row decoder B decodes row address 416 to access the location in region B for the ECC access. Note that for the data access in memory region A, a full word-line in the data region below boundary 408 is activated (not shown). This involves activating two partial word-lines in both quad A0 and quad A1 (not shown). At the same time, for the ECC access in memory region B, a full word-line in the ECC region above boundary 410 is activated (not shown). This involves activating two partial word-lines in both quad B0 and quad B1 (not shown). In this embodiment, because each column I/O 404 or 406 and hence the associated datapath 418 or datapath 420 on each side of the memory bank, is shared by the two memory regions located on the same side, a multiplexing mechanism (e.g., spatial multiplexing or temporal multiplexing) is generally required to share the data and associated ECC over the respective column I/O and the datapath.

In some embodiments, the two halves of each region A or region B can be independently addressed. In other words, each row decoder can be configured to select either the left sub-word-line (i.e., the left half-page) or the right sub-word-line (i.e., the right half-page) of a full word-line within the respective storage region. In these embodiments, row address 414, which is used to access data at a location in region A, includes a special bit to select either quad A0 or quad A1, and row address 416, which is used to access ECC at a location in region B, includes a special bit to select either quad B0 or quad B1 (which is usually on the opposite side of the row decoders from the selected quad in region A). Control circuit 412 then routes the two row addresses to row decoder A and row decoder B, respectively. Next, row decoder A decodes row address 414, which involves selecting either quad A0 or quad A1 of region A for the data access based on the special bit in row address 414. At the same time, row decoder B decodes row address 416, which involves selecting either quad B0 or quad B1 of region B for the ECC access based on the special bit in row address 416.

For example, FIG. 4 shows that during a data access to region A, quad A0 is selected and a partial word-line 422 in quad A0 below boundary 408 (i.e., the data area) is activated. At the same time, row decoder B selects quad B1 where a partial word-line 424 in quad B1 above boundary 410 (i.e., the ECC area) is activated. Note that, because the two quads (i.e., A0/B0 or A1/B1) on the same side of the row decoders share a common column I/O and hence share a datapath, the concurrent data access and ECC access are directed to areas on the opposite sides of the row decoders (i.e., A0/B1 or A1/B0). Hence, the two concurrent memory accesses to memory bank 402 in FIG. 4 result in two partial word-line activations in two of the four independently addressable storage regions.

Figure 5:
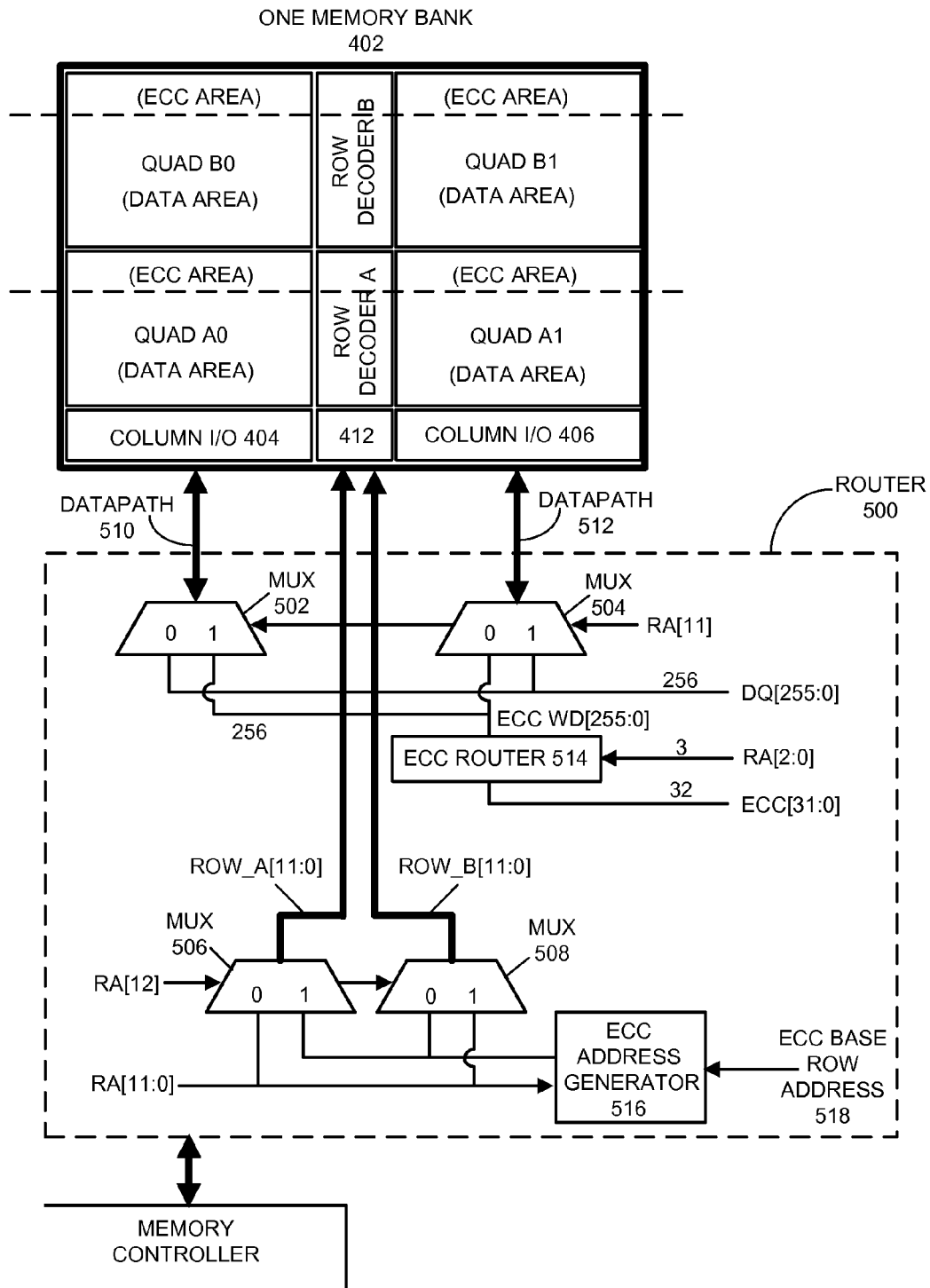
FIG. 5 illustrates an exemplary address and data router which is located on an ASIC buffer between a memory bank and a host memory controller.

FIG. 5 illustrates an exemplary address and data router 500 which is located on an ASIC buffer between memory bank 402 and a memory controller. In one embodiment, address and data router 500 ("router 500" hereinafter) is part of the memory device which contains memory bank 402. In a further embodiment, router 500 is part of the memory interface of the memory device which contains memory bank 402. In this embodiment, router 500 may be used to write data and the associated error information to respective data and ECC storage areas in memory bank 402 in response to a write command received at router 500. Router 500 may also be used to output data and the associated error information from respective data and ECC storage areas in memory bank 402 in response to a read command received at router 500.

As is illustrated in FIG. 5, router 500 includes a number of MUXs, including MUXs 502, 504, 506, and 508. For clarity, only the write path is illustrated in FIG. 5, although a read path is also supported. MUX 502 and MUX 504 are data and ECC MUXs which select between a 256-bit data input DQ[255:0] and a 256-bit ECC input generated from ECC router 514 based upon a 32-bit ECC input ECC[31:0]. Note that, although the example shows an 8:1 data to ECC ratio, other embodiments can have different data to ECC ratios between the data and ECC inputs.

More specifically, each of MUXs 502 and 504 is coupled to a respective column I/O 404 and column I/O 406 through 256-bit wide datapaths 510 and 512. Both MUXs also receive a single-bit selection signal RA[11], which is the 11th bit of a row address RA[12:0] to be used for the memory access. In the embodiment shown, if RA[11] is set to 0, then MUX 502 selects data DQ[255:0] as the input to the left side of memory bank 402, while MUX 504 selects the associated ECC WD[255:0] as the input to the right side of memory bank 402. On the other hand, if RA[11] is set to 1, then MUX 502 selects ECC WD[255:0] as the input to the left side of memory bank 402, while MUX 504 selects DQ[255:0] as the input to the right side of memory bank 402. In this manner, router 500 ensures that data and the associated ECC are stored on opposite sides of the row decoders in memory bank 402. Note that an ECC router 514 is used to expand a 32-bit ECC[31:0] into a 256-bit wide ECC WD[255:0] to match the 256-bit wide datapath.

MUX 506 and MUX 508 are address MUXs which select between a row address for data access and a row address for ECC access, and then direct the selected row address to region A (the bottom half) and region B (the top half) of memory bank 402, respectively. More specifically, both MUXs 506 and 508 are coupled to control circuit 412 on memory bank 402 through respective address buses ROW_A[11:0] and ROW_B[11:0]. Both MUXs also receive a single-bit selection signal RA[12], which is the 12th bit of the row address RA[12:0] to be used for the memory access. In this embodiment, if RA[12] is set to 0, then MUX 506 selects the data address RA[11:0] as input to control circuit 412, which then routes the address to row decoder A, while MUX 508 selects the ECC address as input to control circuit 412, which then routes the address to row decoder B. In other words, router 500 routes data to region A (i.e., the bottom half) of memory bank 402 and the associated ECC to region B (i.e., the top half) of memory bank 402. On the other hand, if RA[12] is set to 1, then MUX 506 selects the ECC address as input to control circuit 412, which routes the address to row decoder A, while MUX 508 selects the data address as input to control circuit 412, which then routes the address to row decoder B. In other words, router 500 routes data to region B of memory bank 402 and the associated ECC to region A of memory bank 402. Note that ECC address generator 516 in FIG. 5 is used to generate the ECC address based on partial data address RA[11:0] and an ECC base row address 518.

Table 1 illustrates different scenarios for routing a data access address RA[10:0] and an ECC access address ECC[10:0] onto different partitions of memory bank 402 based on two-bit selection signal RA[12:11].

TABLE 1

| RA[12:11] | Quad A0 | Quad A1 | Quad B0 | Quad B1 |
|---|---|---|---|---|
| 00 | RA[10:0] | | | ECC[10:0] |
| 01 | | RA[10:0] | ECC[10:0] | |
| 10 | | ECC[10:0] | RA[10:0] | |
| 11 | ECC[10:0] | | | RA[10:0] |

Figure 6B:
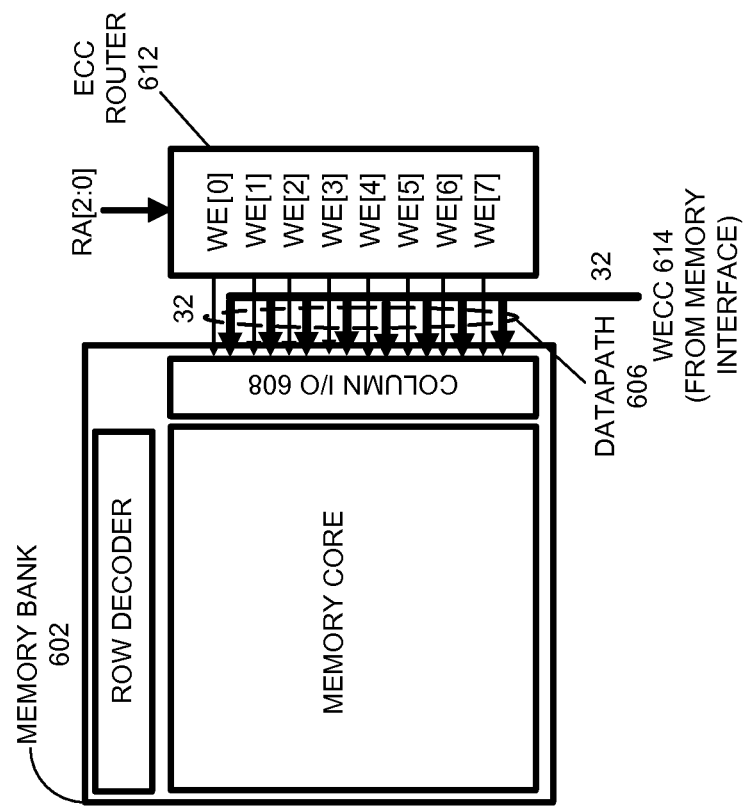
FIG. 6B illustrates an exemplary ECC router for routing an ECC from a memory controller to a memory bank during a write access.
Figure 6A:
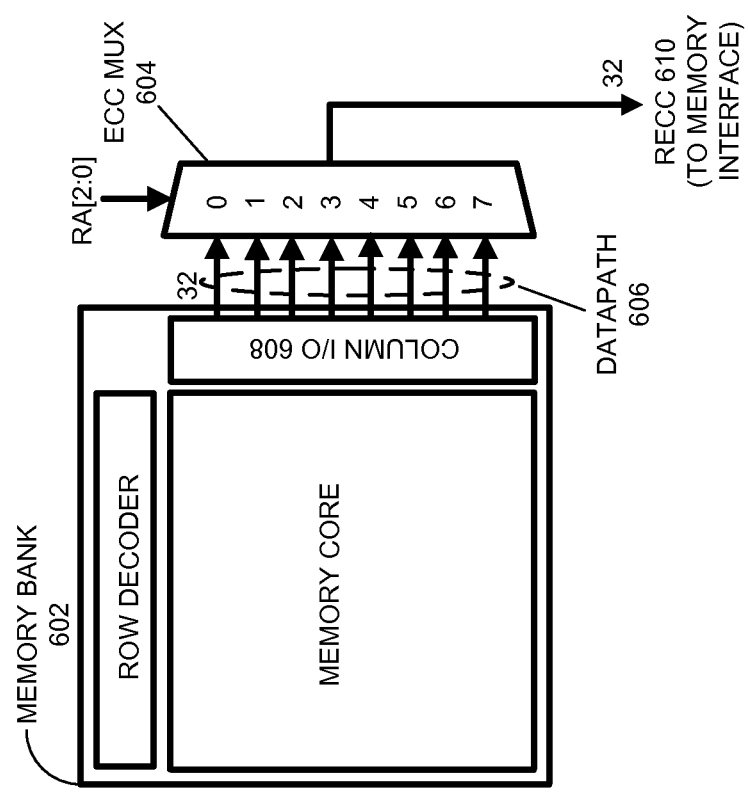
FIG. 6A illustrates an exemplary ECC multiplexer for routing ECCs retrieved from a memory bank to a memory controller during a read memory access.

FIG. 6A illustrates exemplary ECC routing/muxing logic for routing ECCs to or from a memory bank 602. More specifically, FIG. 6A illustrates an exemplary ECC MUX 604 for routing ECCs retrieved from memory bank 602 to a memory controller during a read memory access. As illustrated in FIG. 6A, ECC MUX 604 receives a 256-bit wide read data output from a datapath 606 coupled to a column I/O 608 in memory bank 602. The 256-bit wide datapath 606 is divided into 8 data lanes, wherein only one of the 32-bit data lanes contains the read-out ECC. ECC MUX 604 then uses the three LSBs RA[2:0] of the ECC row address to select the 32-bit data lane, which contains the ECC RECC 610 and subsequently outputs RECC 610 to the memory interface. While FIG. 6A illustrates that the three LSBs of the row address for the read memory access are used as the 8:1 selection signal, other embodiments can choose to use a different set of 3 bits within the row address as the selection signal.

FIG. 6B illustrates an exemplary ECC router 612 for routing an ECC WECC 614 from a memory interface to memory bank 602 during a write access. As illustrated in FIG. 6B, 32-bit wide ECC signal WECC 614 is broadcast to all of the eight 32-bit data lanes in datapath 606. For each data lane, ECC router 612 also provides a write enable signal, namely WE[0] to WE[7]. The data lane which is designated to transmit the write ECC is then enabled by the corresponding WE signal which is selected by three LSBs RA[2:0] of the ECC row address. While FIG. 6B illustrates that the three LSBs of the row address for the write access can be used as the 8:1 selection signal, other embodiments can choose to use a different set of 3 bits within the row address as the selection signal.

FIG. 7 illustrates the timing for various signals, including memory access signals, and data and ECC signals during write transactions between a memory controller and exemplary memory bank 402. As illustrated in the top half of FIG. 7, two column-write transactions take place concurrently in data region A and in ECC region B of memory bank 402. More specifically, to initiate a write transaction, two row-activate transactions labeled "ACT" are simultaneously transmitted to region A and region B. After a predetermined delay, two consecutive column-write transactions labeled "WR" are issued to region A, which are followed by a 256-bit-wide write data block "WD." At the same time, two consecutive column-write transactions "WR" are issued to region B, which are followed by a 32-bit-wide write ECC block "WECC." In some embodiments, the two concurrent write transactions illustrated in FIG. 7 are directed to different row addresses in region A and region B, but the locations of the two write transactions share a common column address. These row-activate and column-write commands cause simultaneous write operations in bank regions A and B, which are followed by concurrent precharge operations labeled "PRE." The bottom half of FIG. 7 illustrates substantially the same write transactions on memory bank 402 except that the data and ECC transactions are reversed in the two memory regions. Such reversible write accesses are supported by the configuration of memory bank 402 because of the symmetry of the two half regions in memory bank 402.

Note that the memory banks described in embodiments of FIGS. 2, 3, and 4 can also be used for non-ECC accesses. In these applications, the data lane carrying the 32-bit ECC is disabled and only data is written to or read from a respective memory bank while the ECC channel is disabled. Moreover, both datapaths in each of these embodiments become dedicated channels for data access so that a full memory capacity can be achieved when the ECC is disabled or not used. Also note that these non-ECC accesses do not require any change on the respective memory bank.

The embodiments of the present disclosure are applicable to different types of memory devices, for example, memory devices adhering to double data rate (DDR) standards, such as DDR2, DDR3, and DDR4, and future generations of memory devices, such as GDDR5, XDR, Mobile XDR, LPDDR, and LPDDR2. However, these embodiments may differ in a number of respects, such as in the structure of the interface logic, the number of bank groups, and the number of memory banks within each bank group in a given memory device.

The preceding description was presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art. Additionally, the above disclosure is not intended to limit the present description. The scope of the present description is defined by the appended claims.

Also, some of the above-described methods and processes can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and apparatus described can be included in but are not limited to, application-specific integrated circuit (ASIC) chips, field-programmable gate arrays (FPGAs), and other programmable-logic devices.

What is claimed is:

1. A method of operating a memory device, the method comprising:
 receiving a write memory access command that specifies a write access of data and a write access of error information associated with the data at a memory bank within the memory device;
 receiving a base row address associated with the write memory access command; and
 generating first and second row addresses based on the base row address;
 wherein the write access of data accesses a first row in a first storage region of the memory bank based on the first row address; and
 wherein the write access of error information accesses a second row in a second storage region of the memory bank based on the second row address.

2. The method of claim 1, wherein the method further comprises writing the data to the first row in parallel with writing the error information associated with the data to the second row.

3. The method of claim 1, wherein the number of storage cells in the first storage region is different than the number of storage cells in the second storage region.

4. The method of claim 3, wherein the number of storage cells in the first storage region is 8 times the number of storage cells in the second storage region.

5. The method of claim 1, wherein the method further comprises:
 using a bit in the first row address to identify the first row to be either in a first subsection or a second subsection of the first storage region in order to access the first row; and
 using a bit in the second row address to identify the second row to be either in a second subsection or a first subsection of the second storage region in order to access the second row.

6. The method of claim 5, wherein:
 if the first row is in the first subsection of the first storage region, the second row is in the second subsection of the second storage region; and
 if the first row is in the second subsection of the first storage region, the second row is in the first subsection of the second storage region.

7. A memory device, comprising:
 a memory bank;
 circuitry to receive a write memory access command that specifies a write access of data and a write access of error information associated with the data at the memory bank;
 circuitry to receive a base row address associated with the write memory access command; and
 circuitry to generate first and second row addresses based on the base row address;
 wherein the write access of data is to access a first row in a first storage region of the memory bank based on the first row address; and
 wherein the write access of error information is to access a second row in a second storage region of the memory bank based on the second row address.

8. The memory device of claim 7, wherein the first storage region and the second storage region are of different respective sizes.

9. The memory device of claim 7, wherein:
 a first row decoder is located between a first subsection and a second subsection of the first storage region; and
 a second row decoder is located between a first subsection and a second subsection of the second storage region.

10. The memory device of claim 9, wherein:
 the first subsection of the first storage region and the first subsection of the second storage region share a first column decoder and a first column input/output (I/O) circuit; and
 the second subsection of the first storage region and the second subsection of the second storage region share a second column decoder and a second column I/O circuit.

11. The memory device of claim 9, wherein:
 if the first row is in the first subsection of the first storage region, the second row is in the second subsection of the second storage region; and
 if the first row is in the second subsection of the first storage region, the second row is in the first subsection of the second storage region.

12. The memory device of claim 7, further comprising:
 circuitry to use a bit in the first row address to identify the first row to be either in a first subsection or a second subsection of the first storage region in order to access the first row; and
 circuitry to use a bit in the second row address to identify the second row to be either in a second subsection or a first subsection of the second storage region in order to access the second row.

13. The memory device of claim 7, embodied as a dynamic random access memory (DRAM) device.

14. A memory device, comprising:
 memory banks;
 circuitry to receive a write memory access command that specifies a write access of data and a write access of error information associated with the data;
 circuitry to receive a base row address associated with the write memory access command for a specified one of the memory banks; and
 circuitry to generate first and second row addresses based on the base row address;
 wherein the write access of data is to access a first row in a first storage region of the specified one of the memory banks based on the first row address; and
 wherein the write access of error information is to access a second row in a second storage region of the specified one of the memory banks based on the second row address.

15. The memory device of claim 14, wherein for each of the memory banks, the first storage region and the second storage region are of different respective sizes.

16. The memory device of claim 14, wherein for each of the memory banks:
 a first row decoder is located between a first subsection and a second subsection of the first storage region; and
 a second row decoder is located between a first subsection and a second subsection of the second storage region.

17. The memory device of claim 16, wherein for each of the memory banks:
 the first subsection of the first storage region and the first subsection of the second storage region share a first column decoder and a first column input/output (I/O) circuit; and
 the second subsection of the first storage region and the second subsection of the second storage region share a second column decoder and a second column I/O circuit.

18. The memory device of claim 16, wherein for each one of the memory banks:
- if the first row is in the first subsection of the first storage region of the one of the memory banks, the second row is in the second subsection of the second storage region of the one of the memory banks; and
- if the first row is in the second subsection of the first storage region of the one of the memory banks, the second row is in the first subsection of the second storage region of the one of the memory banks.

19. The memory device of claim 14, further comprising for each of the memory banks:
- circuitry to use a bit in the first row address to identify the first row to be either in a first subsection or a second subsection of the first storage region in order to access the first row; and
- circuitry to use a bit in the second row address to identify the second row to be either in a second subsection or a first subsection of the second storage region in order to access the second row.

20. The memory device of claim 14, embodied as a dynamic random access memory (DRAM) device.

* * * * *